United States Patent [19]
Ghezzi et al.

[11] Patent Number: 5,527,728
[45] Date of Patent: Jun. 18, 1996

[54] METHOD OF MAKING THIN OXIDE PORTIONS CONSISTING OF GATE AND TUNNEL OXIDES PARTICULARLY IN ELECTRICALLY ERASABLE AND PROGRAMMABLE READ-ONLY MEMORY CELLS

[75] Inventors: Paolo Ghezzi, Rivolta D'Adda; Federico Pio, Milan; Carlo Riva, Monza, all of Italy

[73] Assignee: SGS-Thomson Microelectronics S.r.l., Agrate Brianza, Italy

[21] Appl. No.: 329,309

[22] Filed: Oct. 26, 1994

Related U.S. Application Data

[62] Division of Ser. No. 988,474, Dec. 10, 1992, Pat. No. 5,393,684.

[30] Foreign Application Priority Data

Dec. 31, 1991 [IT] Italy ................... MI91A3355

[51] Int. Cl.$^6$ ........................... H01L 21/8247
[52] U.S. Cl. .................. 437/43; 437/30; 437/979
[58] Field of Search ................... 437/30, 43, 149, 437/150, 153, 154, 979, 985; 148/DIG. 116, DIG. 163

[56] References Cited

U.S. PATENT DOCUMENTS

| | | | |
|---|---|---|---|
| 4,945,068 | 7/1990 | Sugaya | 437/43 |
| 4,957,877 | 9/1990 | Tam et al. | 437/43 |
| 5,198,381 | 3/1993 | Chang et al. | 437/43 |
| 5,215,934 | 6/1993 | Tzeng | 437/979 |
| 5,273,923 | 12/1993 | Chang et al. | 437/43 |

FOREIGN PATENT DOCUMENTS

| | | |
|---|---|---|
| 0197284 | 10/1986 | European Pat. Off. . |
| 0350771 | 1/1990 | European Pat. Off. . |
| 2931031 | 2/1980 | Germany . |

OTHER PUBLICATIONS

Patent Abstracts of Japan, vol. 10, No. 384 (E–466) (2441) JP–A–61174774 (Toshiba Corp) Aug. 6, 1986.

Primary Examiner—Chandra Chaudhari
Attorney, Agent, or Firm—David M. Driscoll; James H. Morris

[57] ABSTRACT

A method for forming thin oxide portions in electrically erasable and programmable read-only memory cells, including the use of the enhanced oxidation effect and the lateral diffusion of heavy doping, for obtaining a tunnel portion whose dimensions are smaller than the resolution of the photolithographic method used.

6 Claims, 2 Drawing Sheets

METHOD OF MAKING THIN OXIDE PORTIONS CONSISTING OF GATE AND TUNNEL OXIDES PARTICULARLY IN ELECTRICALLY ERASABLE AND PROGRAMMABLE READ-ONLY MEMORY CELLS

This application is a division of application Ser. No. 07/988,474 filed Dec. 10, 1992, now U.S. Pat. No. 5,393,684.

BACKGROUND OF THE INVENTION

1. Field of the Invention

The present invention relates to a method for forming thin oxide regions particularly in electrically erasable and programmable read-only memory cells.

2. Discussion of the Related Art

In conventional electrically erasable and programmable read-only memory cells, technically known as EEPROMs, it is advantageous to delimit an oxide portion in which it is possible to grow a thinner oxide, so that the electric writing and erasure of the cell can occur through such portion.

One of the problems encountered with these EEPROM devices is caused by the lithographic process. As is known to those skilled in the art, the dimensional limit for a given technology is set by the photolithographic method employed, through which it is possible to define structures whose dimensions exceed a given value.

Furthermore, radiation-induced damage due to so-called "dry etching" often occurs in these devices. This type of etching does not allow removal of the gate oxide from a surface portion which is greater than the desired tunnel dimensions.

In addition to the problem which arises from the type of etching, it is also very difficult to etch the oxide on limited areas, because one must work at the limit of what is technologically feasible.

Another problem associated with conventional EEPROM cells is related to controlling the dimensions of the tunnel portion, whose variability affects the capacitive coupling of the cell and thus its electric performance.

SUMMARY OF THE INVENTION

Accordingly, an aim of the present invention is to substantially eliminate or substantially reduce the problems described above in connection with conventional EEPROM cells.

Another aim is to provide a method for producing thin oxide structures for applications in EEPROM cells which substantially reduces, and possibly eliminates, the problems related to the limits of the photolithographic process.

Within the scope of the above aims, an object of the present invention is to provide a method which improves efficiency in controlling the area of the thin oxide element.

Another object of the present invention is to provide a method which is highly reliable, relatively easy to perform and can be performed at competitive costs.

This aim, the objects mentioned and others which will become apparent hereinafter to those skilled in the art are achieved by a method for producing tunnel structures in EEPROM cells. The method includes the following steps: defining an active area on a doped silicon substratum by growing gate oxide regions; generating protective portions of a first layer of radiation-sensitive material on the active area and gate oxide regions; heavily doping the active area; removing the protective portions of the first layer of radiation-sensitive material; growing a first oxide layer on the active area; generating protective portions of a second layer of radiation sensitive-material which surround an opening in the active area; lightly doping the active area; removing a portion of the first oxide layer within the opening; removing the protective portions of the second layer of radiation-sensitive material: and growing a second oxide layer on the active area.

Further characteristics and advantages of the invention will become apparent from a reading of the description of a preferred but not exclusive embodiment of a method for producing tunnel structures in electrically erasable and programmable read-only memory cells, in the particular example, with a single polysilicon level, illustrated only by way of a non-limiting example in the accompanying drawings.

DETAILED DESCRIPTION OF THE INVENTION

Hereinafter, the term "to mask" or "masking" defines the conventional photolithographic process by means of which the radiation-sensitive material is made soluble or insoluble by exposure to a source of radiation which is controlled and filtered by a mask which bears the layout of the individual layer. In most practical cases, the radiation-sensitive material is constituted by light-sensitive resin, technically termed photoresist, whereas the radiation source is usually an electromagnetic radiation source, generally in the visible-light range. The term "etching" defines the chemical incision of the layers of a calibration structure. The term "doping" defines the introduction of impurities by means of high-energy implantation, by means of gaseous diffusion or other equivalent implantation processes.

Figure 1A:
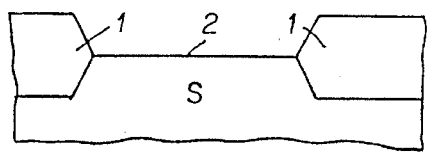
FIGS. 1a to 1k are cross-sectional views of a structure showing the steps of a conventional prior art method.
Figure 1B:
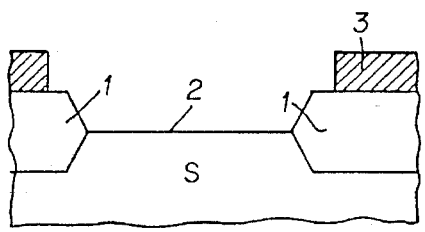
Figure 1C:
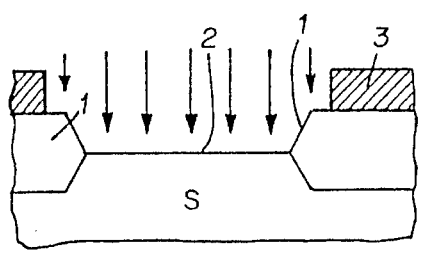

With reference to FIGS. 1a to 1k, a conventional method for producing a tunnel structure includes the following steps: A preparation step, shown in FIG. 1a, wherein an active area 2 is delimited in EEPROM cells on a doped silicon substratum S by growing gate oxide regions 1;

A first deposition step, shown in FIG. 1b, wherein a layer 3 of radiation-sensitive material is deposited on the device: the layer 3 is subsequently masked and its soluble portions are removed, leaving protective portions 3 on the gate oxide regions 1 which limit each EEPROM cell;

A first doping step, shown in FIG. 1c, wherein a light n-doping is performed on the active area 2 of the EEPROM cells.

Figure 1D:
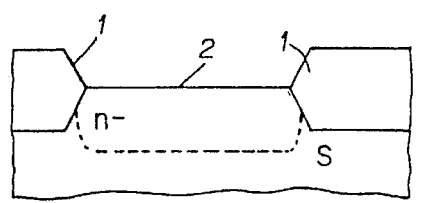
Figure 1E:
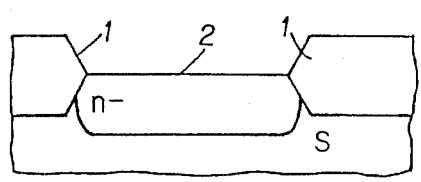
Figure 1F:
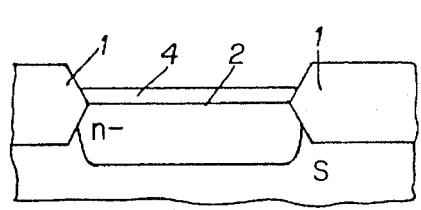
Figure 1G:
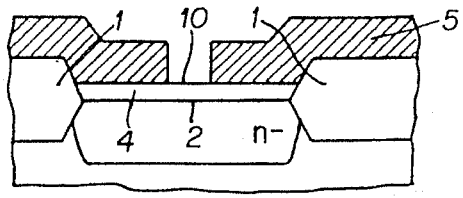
Figure 1H:
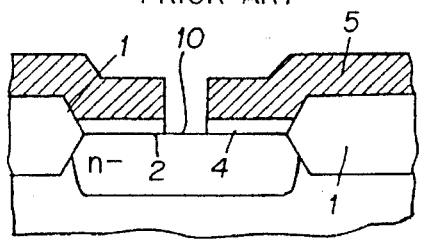
Figure 1I:
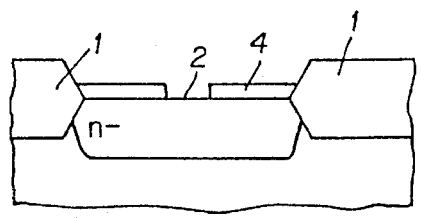
Figure 1J:
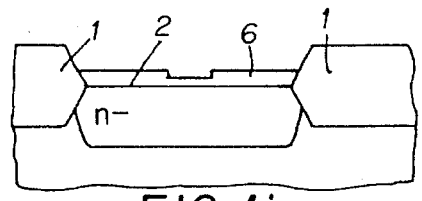
Figure 1K:
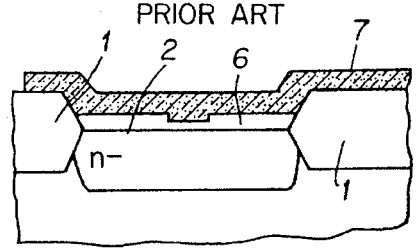
Figure 2A:
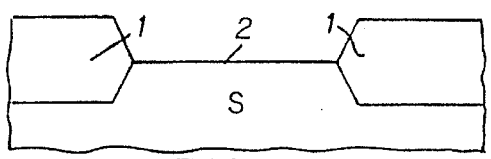
FIGS. 2a to 2l are cross-sectional views of a structure showing the steps of the method according to the present invention.
Figure 2B:
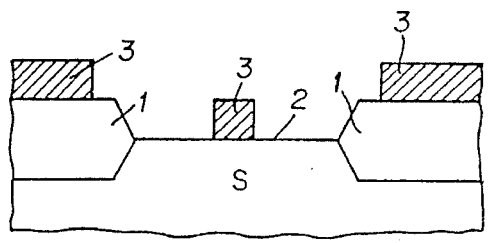
Figure 2C:
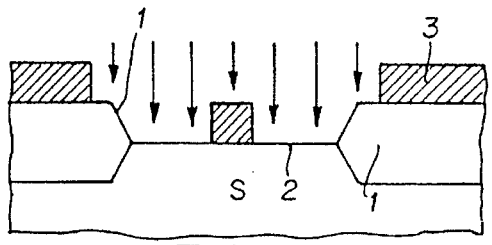
Figure 2D:
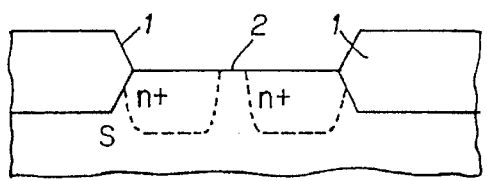
Figure 2E:
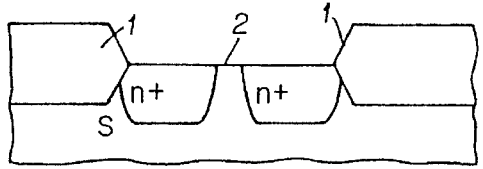
Figure 2F:
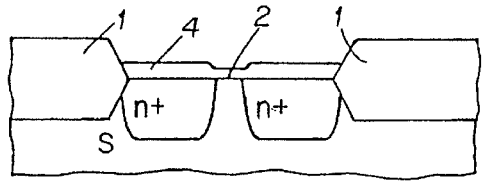
Figure 2G:
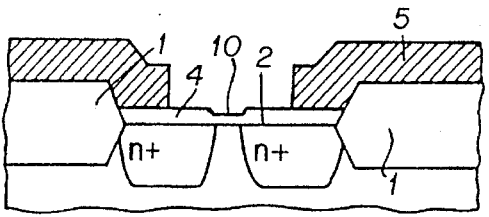
Figure 2H:
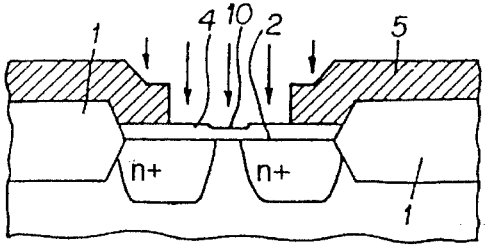
Figure 2I:
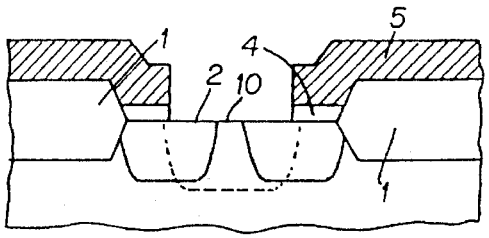
Figure 2J:
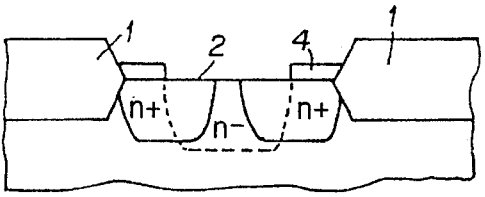
Figure 2K:
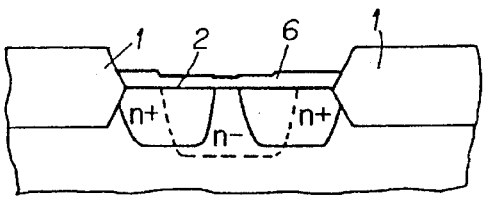
Figure 2L:
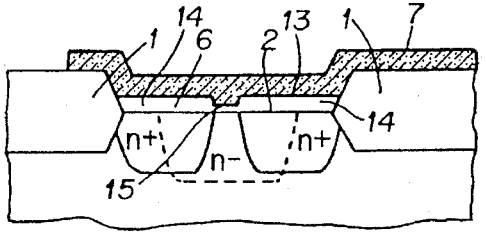

A first cleaning step, shown in FIG. 1d, wherein the protective portions 3 of radiation-sensitive material are removed from the gate oxide regions 1;

A diffusion step, shown in FIG. 1e, wherein the lightly doped drains are diffused;

A first growth step, shown in FIG. 1f, wherein a layer 4 of gate oxide is grown on the active area 2;

A second deposition step, shown in FIG. 1g, wherein a layer 5 of radiation-sensitive material is deposited on the device and is subsequently masked; soluble portions thereof are then removed, leaving open a central portion 10 of the active area 2 of the cell;

An etching step, shown in FIG. 1h, wherein the gate oxide 4 is removed from the open portion 10 exposed during the second deposition step;

A second cleaning step, shown in FIG. 1i, wherein the protective portions 5 of radiation-sensitive material are removed;

A second growth step, shown in FIG. 1j, wherein another layer of oxide 6 is grown on the active area 2; and A third deposition step, shown in FIG. 1k, wherein a layer 7 of polysilicon is deposited on the device and subsequently masked and partially removed by etching yielding the floating gate electrode.

With reference to FIGS. 2a to 2l, wherein like reference characters denote similar features to those of FIGS. 1a–1k, a method for producing tunnel structures according to the present invention includes the following steps:

A preparation step (FIG. 2a) wherein an active area 2 is delimited on a doped silicon substratum S, by growing gate oxide regions 1, in the EEPROM cells;

A first deposition step (FIG. 2b) wherein a layer 3 of radiation-sensitive material is deposited on the device and is subsequently masked; the soluble portions thereof are then removed, leaving protective portions 3 on the active area 2 and on the gate oxide regions 1, limiting each EEPROM cell;

A first doping step (FIG. 2c) wherein heavy doping is performed on the actives area 2 of the EEPROM cells;

A first cleaning step (FIG. 2d) wherein the protective portions 3 of radiation-sensitive material are removed from the active area 2 and from the gate oxide regions 1;

A diffusion step (FIG. 2e) wherein the heavily doped drains are diffused;

A first growth step (FIG. 2f) wherein a gate oxide layer 4 is grown on the active area 2;

A second deposition step (FIG. 2g) wherein a layer 5 of radiation-sensitive material is deposited on the device and is subsequently masked; soluble portions thereof are then removed, leaving open a central portion 10 of the active area 2 of the cell;

A second doping step (FIG. 2h) wherein light doping is performed on the active area 2 of each memory cell;

An etching step (FIG. 2i) wherein the gate oxide 4 is removed from the central portion 10 exposed during the second deposition step;

A second cleaning step (FIG. 2j) wherein the protective portions 5 of radiation-sensitive material are removed;

A second growth step (FIG. 2k) wherein a further oxide layer 6 is grown on the active area 2; and A third deposition step (FIG. 2l) wherein a layer 7 of polysilicon is deposited on the device and is subsequently masked and partially removed by etching, yielding the floating gate electrode.

In this manner a tunnel oxide portion 13 is obtained whose dimensions are smaller than the resolution of the photolithographic method used.

The so-called "enhanced oxidation effect", is exploited during the definition of the tunnel oxide portion 13, i.e. the phenomenon by virtue of which greater oxidation occurs where substratum doping is higher. Accordingly, the gate oxide 14 which grows above the more heavily doped portions n+ is thicker than the oxide 15 grown upon the less heavily doped portions. The thickness of approximately 15 nanometers makes the oxide 14 grown in this manner an excellent insulator.

The high thickness of the gate oxide 14 above the more heavily doped portions n+ is achieved in the two following steps which are ensured by two different and easily controllable effects: the first step, which is the first doping step (FIG. 2c), wherein lateral diffusion of the heavy doping occurs; and the second step (FIG. 2k), which uses the enhanced oxidation effect wherein the oxide thickness is different above the heavily doped portions than above the portions with less heavy n- doping implantation.

The electrical operating characteristics of the cell produced by the method of the present invention are better than those of a conventional cell.

Advantageously, the tunnel oxide portions obtained with the method according to the invention have dimensions which are smaller than the resolution of the photolithographic method employed.

The provision of a tunnel with such dimensions also leads to a benefit in the capacitive couplings of the cell, allowing a reduction in the overall dimensions of said cell.

With the method of the present invention, silicon oxide etchings can be performed with a wet process, using known substances, such as, for example, hydrofluoric acid ($HF:H_2O$) or any other substance which can etch the oxide without damaging the surface of the device. These etchings allow removal of the gate oxide from a surface which is larger than the final dimensions of the tunnel portion.

These results conveniently lead to a degree of manufacturing freedom which is absent in conventional cells.

Practical tests have shown that the present invention achieves the intended aim and objects, including providing a method for defining thin oxide portions particularly for EEPROM cells with dimensions which are smaller than the resolution of the photolithographic method used.

The method according to the present invention can have numerous modifications and variations and remain within the scope of the inventive concept. All of the details may be replaced with other technically equivalent elements as will be apparent to those skilled in the art. In practice, the materials employed, as well as the dimensions, may be any according to the particular requirements in specific applications.

Having thus described one particular embodiment of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended as limiting. The invention is limited only as defined in the following claims and the equivalents thereto.

What I claim is:

1. A method for producing an EEPROM cell comprising the steps of:

defining an active area on a silicon substrate;

masking a portion of the active area;

doping the active area at a first doping level yielding regions having the first doping level;

growing a first oxide layer on the active area;

masking portions of the first oxide layer;

doping the active area at a second doping level yielding regions having the second doping level;

removing a portion of the first oxide layer; and growing a second oxide layer on the active area simultaneously yielding gate oxide regions over the regions having the first doping level and a tunnel oxide region over the region having the second doping level.

2. A method for producing an EEPROM cell comprising the steps of:

defining an active area on a silicon substrate;

masking portions of the active area;

doping the portions of the active area at a first doping level yielding regions having the first doping level;

growing a first oxide layer on the active area;

doping the active area at a second doping level yielding a region having the second doping level; and forming gate oxide regions over the regions having the first doping level and a tunnel oxide region over the region having the second doping level by growing a second oxide layer on the active area.

3. The method of claim 1, wherein the step of growing a second oxide layer includes simultaneously forming the gate oxide regions and the tunnel oxide region, the gate oxide regions having a greater thickness than the tunnel oxide region.

4. The method of claim 2 wherein the step of forming includes simultaneously forming gate oxide regions and the tunnel oxide region, the gate oxide regions having a greater thickness than the tunnel oxide region.

5. The method of claim 1 wherein the steps of doping the active area at the first doping level and doping the active area at the second doping level include doping the active area at the first doping level and doping the active area at the second doping level such that the first doping level is greater than the second doping level.

6. The method of claim 2 wherein the steps of doping the active area at the first doping level and doping the active area at the second doping level include doping the active area at the first doping level and doping the active area at the second doping level such that the first doping level is greater than the second doping level.

\* \* \* \* \*

UNITED STATES PATENT AND TRADEMARK OFFICE

CERTIFICATE OF CORRECTION

PATENT NO. : 5,527,728
DATED      : June 18, 1996
INVENTOR(S): Paolo GHEZZI, Federico PIO and Carlo RIVA It is certified that error appears in the above-identified patent and that said Letters Patent is hereby corrected as shown below:

```
On title page, item
```
   [75]   Paolo Ghezzi, Rivolta D'Adda; Federico Pio, Brugherio; Carlo Riva, Monza, all of Italy Signed and Sealed this Twenty-fifth Day of February, 1997

Attest:

BRUCE LEHMAN

*Attesting Officer*  *Commissioner of Patents and Trademarks*